United States Patent
Goto et al.

(10) Patent No.: US 10,847,849 B2
(45) Date of Patent: Nov. 24, 2020

(54) INSPECTION METHOD OF ELECTRICAL STORAGE DEVICE AND MANUFACTURING METHOD THEREOF

(71) Applicant: TOYOTA JIDOSHA KABUSHIKI KAISHA, Toyota (JP)

(72) Inventors: Takeshi Goto, Kasugai (JP); Kiwamu Kobayashi, Anjo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 70 days.

(21) Appl. No.: 16/191,679

(22) Filed: Nov. 15, 2018

(65) Prior Publication Data

US 2019/0198943 A1 Jun. 27, 2019

(30) Foreign Application Priority Data

Dec. 25, 2017 (JP) .................. 2017-248113

(51) Int. Cl.
*H01M 10/48* (2006.01)
*H01M 10/42* (2006.01)
(Continued)

(52) U.S. Cl.
CPC ...... *H01M 10/482* (2013.01); *G01R 31/3865* (2019.01); *G01R 31/396* (2019.01);
(Continued)

(58) Field of Classification Search
CPC .... H01M 10/48; H01M 10/42; H01M 10/425; H01M 10/482; H01M 10/4285; G01R 31/396; G01R 31/3865; G01R 31/392
See application file for complete search history.

(56) References Cited

U.S. PATENT DOCUMENTS

| 7,532,024 B2 * | 5/2009 | Balog ................ G01R 31/2894 |
| | | 324/762.01 |
| 2002/0075030 A1 * | 6/2002 | Schittenhelm ......... G01R 31/14 |
| | | 324/750.02 |

(Continued)

FOREIGN PATENT DOCUMENTS

| JP | 2010153275 | * | 8/2010 |
| JP | 2010-153275 A | | 7/2018 |

OTHER PUBLICATIONS

U.S. Appl. No. 16/057,022, Notice of Allowance dated Mar. 26, 2020 (Year: 2020).*

(Continued)

*Primary Examiner* — Alexander Usyatinsky
(74) *Attorney, Agent, or Firm* — Sughrue Mion, PLLC

(57) ABSTRACT

An inspection method of an electrical storage device includes: setting a pseudo parasitic resistance value to be small in a case where a power storage capacity of the electrical storage device is large, while setting the pseudo parasitic resistance value to be large in the case where the power storage capacity is small; in a state where the pseudo parasitic resistance value is set, acquiring a current value after convergence of a current flowing through a circuit such that the circuit is formed by connecting an external power source to the charged electrical storage device in a direction where a voltage is applied thereto; and determining quality of the electrical storage device based on the current value.

3 Claims, 11 Drawing Sheets

(51) Int. Cl.
  *G01R 31/396* (2019.01)
  *G01R 31/385* (2019.01)
  *G01R 31/392* (2019.01)

(52) U.S. Cl.
  CPC ......... *H01M 10/425* (2013.01); *H01M 10/48* (2013.01); *G01R 31/392* (2019.01); *H01M 10/4285* (2013.01)

(56) References Cited

U.S. PATENT DOCUMENTS

2009/0015280 A1* 1/2009 Natori ................ G01R 31/2891
  324/762.05
2013/0171481 A1* 7/2013 Hotta .................. H01M 2/1077
  429/50

OTHER PUBLICATIONS

JP 2010153275MT (Year: 2010).*
U.S. Appl. No. 16/057,022, filed Aug. 7, 2018, Takeshi Goto et al.
Notice of Allowance issued to U.S. Appl. No. 16/057,022 dated Jan. 21, 2020.
Supplemental Notice of Allowance issued to U.S. Appl. No. 16/057,022 dated Mar. 19, 2020.
Notice of Allowance issued to U.S. Appl. No. 16/057,022 dated Jun. 4, 2020.

* cited by examiner

COMPARATIVE EXAMPLE

COMPARATIVE EXAMPLE

INSPECTION METHOD OF ELECTRICAL STORAGE DEVICE AND MANUFACTURING METHOD THEREOF

INCORPORATION BY REFERENCE

The disclosure of Japanese Patent Application No. 2017-248113 filed on Dec. 25, 2017 including the specification, drawings and abstract is incorporated herein by reference in its entirety.

BACKGROUND

1. Technical Field

The disclosure relates to an inspection method for determining quality of an electrical storage device. More specifically, the disclosure relates to an inspection method for an electrical storage device, the inspection method being able to quickly perform quality determination based on a discharge current amount, not based on a voltage drop amount of the electrical storage device. The disclosure also relates to a manufacturing method of an electrical storage device, the manufacturing method including the inspection method of the electrical storage device as part of steps.

2. Description of Related Art

Various inspection methods have been conventionally proposed as an inspection method for determining quality of electrical storage devices such as a secondary battery. For example, in Japanese Unexamined Patent Application Publication No. 2010-153275 (JP 2010-153275 A), a leaving step of leaving a secondary battery as a determination target to stand in a pressurized state is performed. A battery voltage is measured before and after the leaving step. A difference between the battery voltages measured before and after the leaving step is a voltage drop amount along with the leaving. A battery with a large voltage drop amount has a large self-discharge amount. On this account, it is possible to determine quality of the secondary battery based on a magnitude of the voltage drop amount. Such an inspection method may be performed as one step in a manufacturing method.

SUMMARY

However, the quality determination of the secondary battery in the related art has the following problems. That is, the quality determination takes time. The reason why the quality determination takes time is because the leaving step should take a long leaving time to obtain a significant voltage drop amount. One factor thereof is a contact resistance at the time of voltage measurement. The voltage measurement is performed by connecting a measuring instrument between terminals of the secondary battery. At this time, a contact resistance is inevitably caused between the terminal on the secondary battery side and a terminal on the measuring instrument side, so that the measurement result is affected by the contact resistance. The contact resistance varies every time the terminal on the secondary battery side is connected to the terminal on the measuring instrument side. On this account, if the voltage drop amount itself is not large to some extent, variations in contact resistance between measurements cannot be ignored.

Further, the accuracy of the voltage measurement itself is not so good. This is because the voltage measurement is affected by a voltage drop in an electric current path at the time of measurement by all means. Further, a contact portion between the terminal on the secondary battery side and the terminal on the measuring instrument side varies to some extent every time they are connected to each other, so that a degree of the voltage drop also varies every measurement. In view of this, it is conceivable to improve measurement accuracy such that a measurement time of a self-discharge amount is shortened by use of current measurement instead of the voltage measurement. This is because the current is uniform at any part in a circuit and therefore the current measurement is barely affected by the contact portion, differently from the voltage measurement. Even so, successful determination may not be achievable just by replacing the voltage measurement with the current measurement. This is because the measurement results are affected by variations in various conditions such as a charging voltage or a measurement environment of the secondary battery.

The disclosure provides an inspection method of an electrical storage device and a manufacturing method of an electrical storage device each of which can perform quality determination of the electrical storage device quickly regardless of variations in various conditions.

One aspect of the disclosure relates to an inspection method of an electrical storage device and the inspection method includes: setting a pseudo parasitic resistance value to be small in a case where a power storage capacity of the electrical storage device is large, as compared to a case where the power storage capacity is small, while setting the pseudo parasitic resistance value to be large in the case where the power storage capacity of the electrical storage device is small, as compared to the case where the power storage capacity is large (a pseudo parasitic resistance setting step), the pseudo parasitic resistance value being obtained by dividing, by a current value of a circuit, an excessive amount of a voltage value of an external power source with respect to an initial voltage value of the electrical storage device; in a state where the pseudo parasitic resistance value is set, acquiring a current value after convergence of a current flowing through the circuit such that the circuit is formed by connecting the external power source to the electrical storage device in a direction where a voltage of the external power source is applied to the electrical storage device (a current measurement step); and determining quality of the electrical storage device based on the current value (a quality determination step).

In the inspection method of the aspect, the quality of the electrical storage device is determined based on current measurement without using voltage measurement. That is, the current value after convergence acquired in the current measurement step indicates a self-discharge current in the electrical storage device. On this account, it is possible to determine the quality of the electrical storage device based on the magnitude of the current value after convergence. Since the current measurement is more accurate than the voltage measurement, surer determination can be performed more quickly. Here, as a resistance value of the circuit is smaller, the current easily flows, and a time necessary for convergence of the current is shorter. That is, it is possible to perform inspection in a short time. However, the current measurement has low accuracy. Particularly, in a case where the power storage capacity of the electrical storage device is small, a low measurement accuracy is exhibited markedly. In view of this, in the present aspect, a value obtained by dividing, by the current value of the circuit, the excessive amount of the voltage value of the external power source with respect to the initial voltage value of the electrical storage device is referred to as a pseudo parasitic resistance value, and the pseudo parasitic resistance value is set appropriately. That is, the pseudo parasitic resistance value is set in accordance with the power storage capacity of the electrical storage device. Hereby, the quality determination of the electrical storage device can be performed quickly regardless of variations of various conditions. Note that the pseudo parasitic resistance value is a sum of an original parasitic resistance of the circuit and a fictitious resistance obtained by converting an increment of the voltage value of the power source into a negative resistance value. In a case where the pseudo parasitic resistance value is set by adjusting a fictitious resistance component, when the power storage capacity of the electrical storage device is small, the voltage of the external power source increases gradually in the current measurement step, and when the power storage capacity of the electrical storage device is large, the voltage of the external power source increases rapidly.

In the inspection method of the first aspect, a parallel stack may be formed by connecting a plurality of the electrical storage devices in parallel to each other. In the acquiring of the current value, the circuit may be formed by connecting the external power source to the parallel stack that has been charged. In the setting of the pseudo parasitic resistance value, the pseudo parasitic resistance value may be set in accordance with the power storage capacity of the parallel stack. In the determining of the quality of the electrical storage device, quality of the parallel stack may be determined. With such a configuration, it is possible to determine the quality of the whole parallel stack more quickly.

A second aspect of the disclosure relates to a manufacturing method of an electrical storage device, and the manufacturing method includes: performing initial charge such that an electrical storage device being assembled and uncharged is charged to a predetermined charged state, such that a charged electrical storage device is formed (an initial charge step); and inspecting the electrical storage device that has been charged by the inspection method according to the first aspect (an inspection step).

With this configuration, an inspection method of an electrical storage device and a manufacturing method of an electrical storage device each of which can perform quality determination of the electrical storage device quickly regardless of variations of various conditions can be provided.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
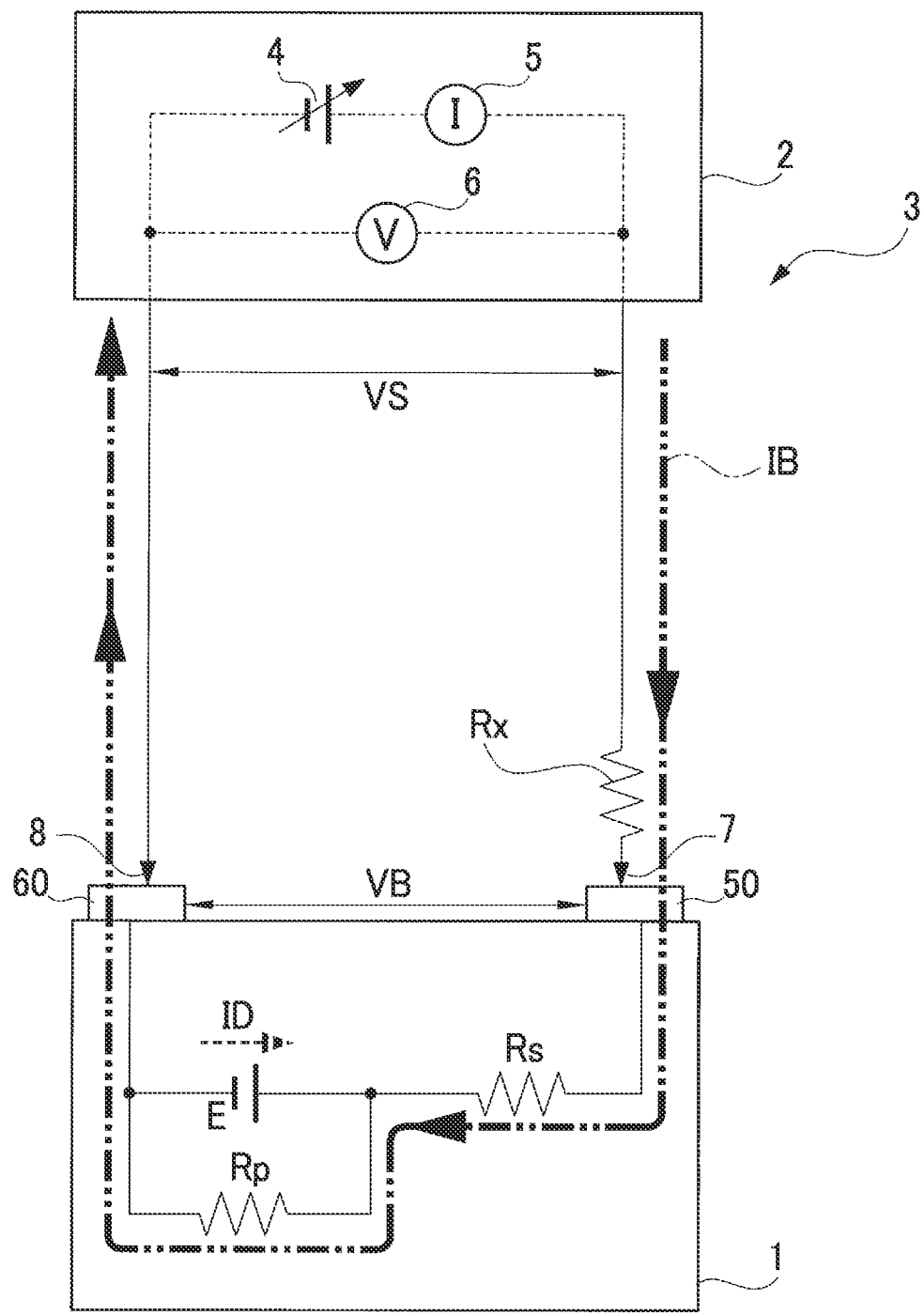
FIG. 1 is a circuit diagram illustrating a configuration of a circuit manufactured to perform an inspection method for a secondary battery in an embodiment.

The following describes an embodiment for embodying the disclosure in detail with reference to the attached drawings. As illustrated in FIG. 1, an inspection method of an electrical storage device in the present embodiment is performed in such a state that a circuit 3 is formed by connecting a measuring device 2 to a secondary battery 1 that is an electrical storage device as an inspection target. First described is a basic principle of the inspection method of the secondary battery 1 by the measuring device 2.

Basic Principle

Figure 2:
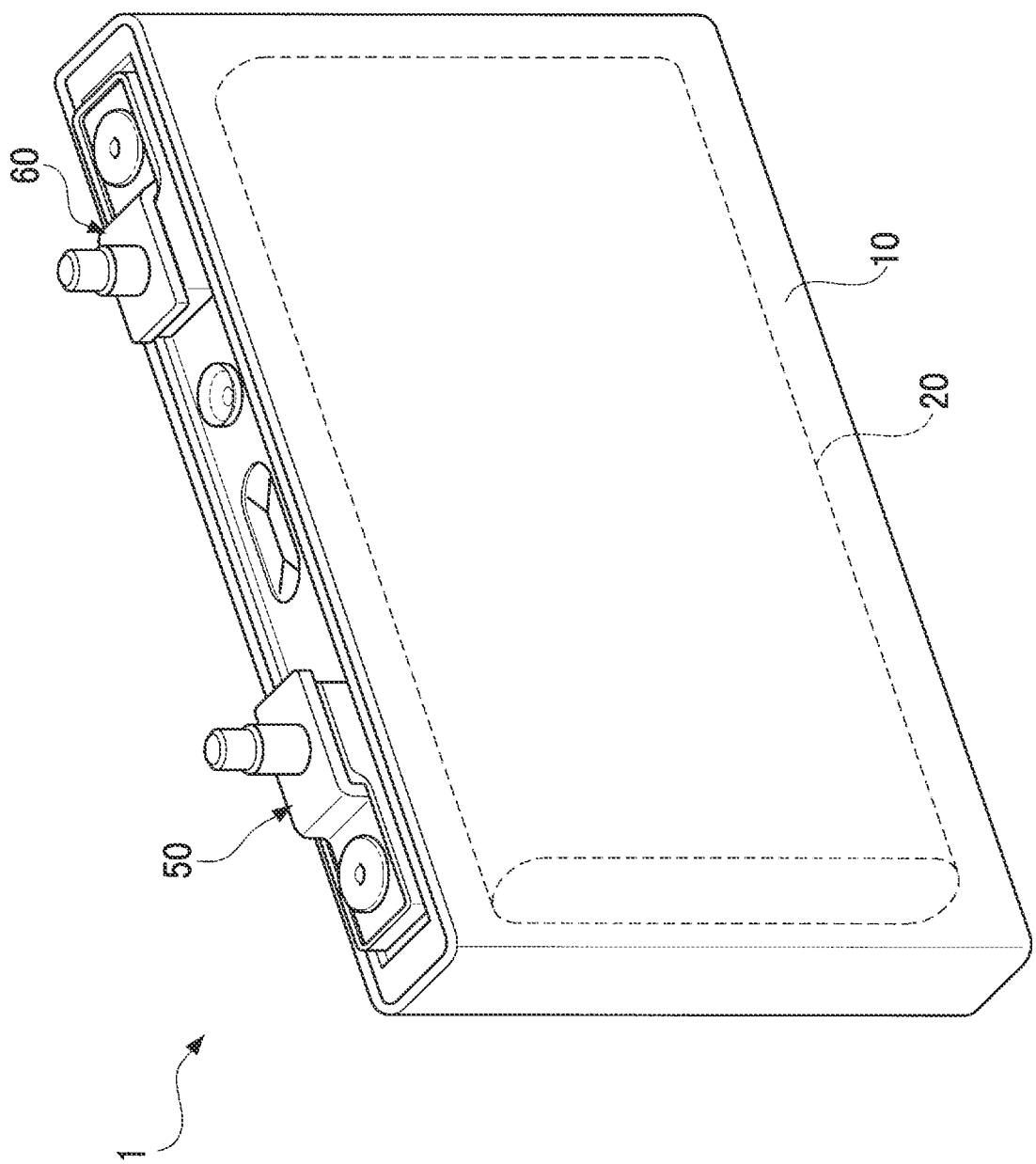
FIG. 2 is an outside drawing illustrating an example of the secondary battery as an inspection target in the embodiment.

The secondary battery 1 is schematically illustrated in FIG. 1, but actually has a flat-square-shaped external appearance as illustrated in FIG. 2, for example. The secondary battery 1 in FIG. 2 is configured such that an electrode laminated body 20 is provided in an outer packaging body 10. The electrode laminated body 20 is configured such that a positive plate and a negative plate are laminated via a separator. An electrolytic solution is also accommodated inside the outer packaging body 10 as well as the electrode laminated body 20. Further, positive and negative terminals 50, 60 are provided on an external surface of the secondary battery 1. Note that the secondary battery 1 is not limited to the one with a flat-square shape as illustrated in FIG. 2 and may be one with other shapes such as a cylindrical shape.

FIG. 1 will be further described. In FIG. 1, the secondary battery 1 is illustrated schematically. The secondary battery 1 in FIG. 1 is expressed as a model constituted by an electromotive element E, an internal resistance Rs, and a short circuit resistance Rp. The internal resistance Rs is placed in series with the electromotive element E. The short circuit resistance Rp is a model of a conductive path to be formed by very small foreign metallic particles that might enter the electrode laminated body 20, and the short circuit resistance Rp is placed in parallel with the electromotive element E.

Further, the measuring device 2 includes a direct-current power source 4, an ammeter 5, a voltmeter 6, and probes 7, 8. The ammeter 5 is placed in series with the direct-current power source 4, and the voltmeter 6 is placed in parallel with the direct-current power source 4. An output voltage VS of the direct-current power source 4 is variable. The direct-current power source 4 is used to apply the output voltage VS to the secondary battery 1 as will be described later. The ammeter 5 measures a current flowing in the circuit 3. The voltmeter 6 measures a voltage between the probes 7, 8. In FIG. 1, the probes 7, 8 of the measuring device 2 are connected to the terminals 50, 60 of the secondary battery 1, so that the circuit 3 is formed.

Further, the circuit 3 of FIG. 1 has a parasitic resistance Rx. The parasitic resistance Rx includes contact resistances between the probes 7, 8 and the terminals 50, 60 in addition to lead wire resistances of various parts in the measuring device 2. Note that, in FIG. 1, the parasitic resistance Rx is present only in the lead wire on the probe 7 side, but this is just for convenience of drawing. In practice, the parasitic resistance Rx is present over the whole circuit 3.

In the inspection method by the measuring device 2, the magnitude of the self-discharge amount of the secondary battery 1 is inspected. When the self-discharge amount is large, the secondary battery 1 is defective, and when the self-discharge amount is small, the secondary battery 1 is non-defective. For this purpose, the secondary battery 1 is charged first before it is connected to the circuit 3. The secondary battery 1 thus charged is connected to the circuit 3 and the self-discharge amount of the secondary battery 1 is calculated by the measuring device 2 in that state. Based on the calculation result, the quality of the secondary battery 1 is determined.

More specifically, the secondary battery 1 that has been charged is connected to the circuit 3. At this time, the charged secondary battery 1 to be connected to the circuit 3 is in a state where high-temperature aging that is generally performed after charging is also finished and a battery voltage is stabilized. Note that the inspection itself in the present embodiment is performed at room temperature. Then, a battery voltage VB of the secondary battery 1 after charging and high-temperature aging is measured. A value measured herein is an initial battery voltage VB1. Subsequently, the output voltage VS of the measuring device 2 is adjusted so as to become the initial battery voltage VB1. Then, the secondary battery 1 is connected to the circuit 3. The output voltage VS at this time is the same as the initial battery voltage VB1 of the secondary battery 1.

In this state, the output voltage VS is the same as the initial battery voltage VB1, and the output voltage VS and the battery voltage VB of the secondary battery 1 are reverse to each other. On this account, those voltages are cancelled, so that a circuit current IB of the circuit 3 is zero. In this state, the output voltage VS of the measuring device 2 is maintained to be constant at the initial battery voltage VB1 and is left to stand.

Figure 3:
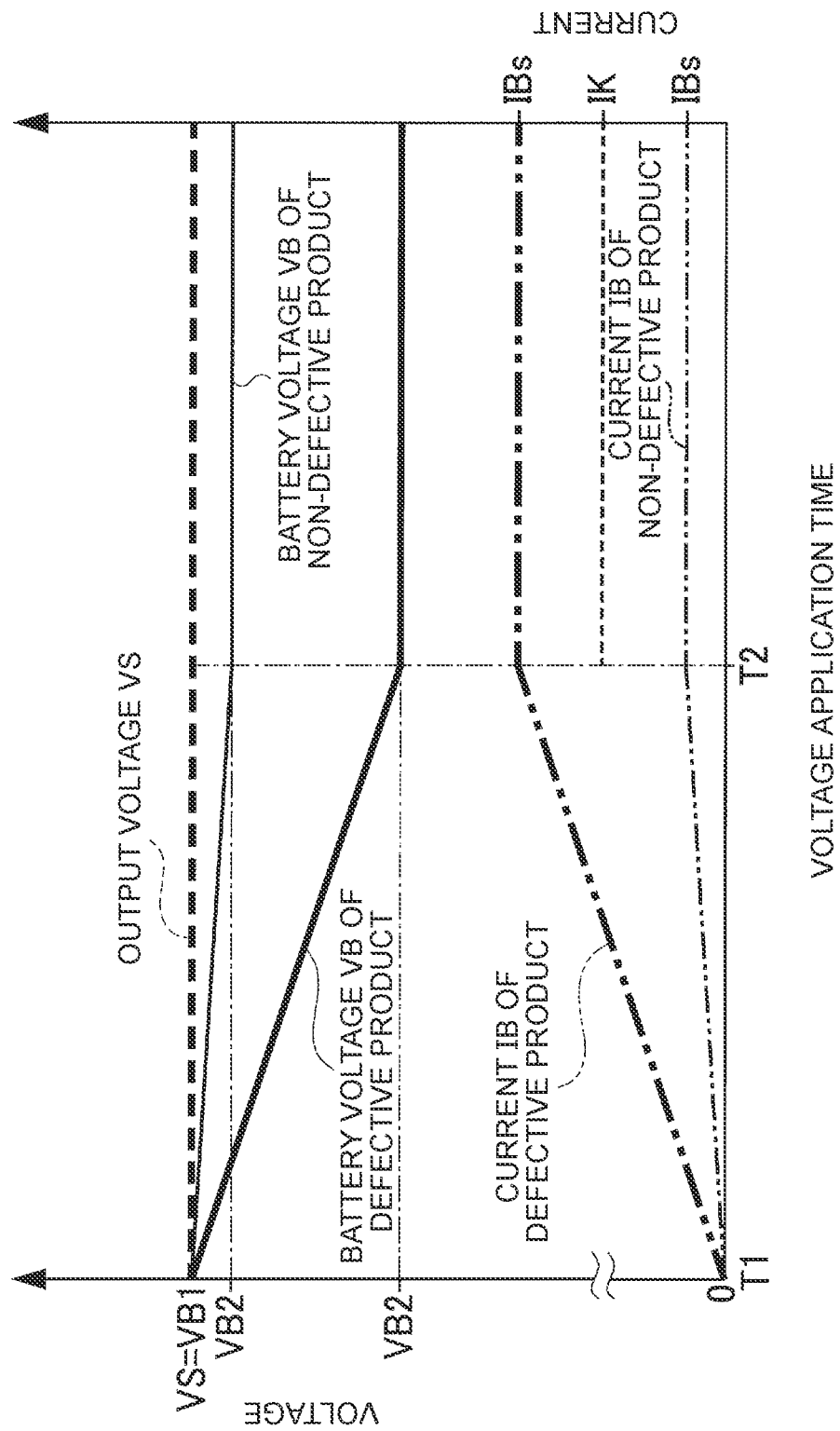
FIG. 3 is a graph illustrating changes of a voltage and a current with time according to a basic principle of inspection.

A subsequent state of the circuit 3 is illustrated in FIG. 3. In FIG. 3, the horizontal axis indicates time, the vertical axis on the left side indicates voltage, and the vertical axis on the right side indicates current. In terms of the time on the horizontal axis, time T1 at the left end in FIG. 3 indicates a timing at which application of the output voltage VS equal to the initial battery voltage VB1 is started as described above. After time T1, the battery voltage VB gradually decreases from the initial battery voltage VB1 due to self-discharge of the secondary battery 1. As a result, the balance between the output voltage VS and the battery voltage VB is lost, so that the circuit current IB flows through the circuit 3. Hereby, the circuit current IB gradually increases from zero. The circuit current IB is directly measured by the ammeter 5. When time T2 comes after time T1, the decrease of the battery voltage VB and the increase of the circuit current IB are both saturated, so that the battery voltage VB and the circuit current IB both become constant (VB2, IBs) afterward.

Note that, as apparent from FIG. 3, in comparison with a non-defective secondary battery 1, in a defective secondary battery 1, the increase of the circuit current IB and the decrease of the battery voltage VB are both steep. Accordingly, a circuit current IBs after convergence in the defective secondary battery 1 is larger than a circuit current IBs after convergence in the non-defective secondary battery 1. Further, a battery voltage VB2 after convergence in the defective secondary battery 1 is lower than a battery voltage VB2 after convergence in the non-defective secondary battery 1.

The reason why the state of the circuit 3 after time T1 becomes the state in FIG. 3 will be described. First, the battery voltage VB decreases because of self-discharge of the secondary battery 1 as described above. Due to the self-discharge, a self-discharge current ID flows through the electromotive element E of the secondary battery 1. When the self-discharge amount of the secondary battery 1 is large, the self-discharge current ID is large, and when the self-discharge amount is small, the self-discharge current ID is small. In the secondary battery 1 in which the value of the short circuit resistance Rp is small, the self-discharge current ID tends to be large.

In the meantime, the circuit current IB flowing due to the decrease of the battery voltage VB after time T1 is a current in a direction to charge the secondary battery 1. That is, the circuit current IB works in a direction to restrain self-discharge of the secondary battery 1, and inside the secondary battery 1, the circuit current IB is reverse to the self-discharge current ID. When the circuit current IB increases and reaches the same magnitude as the self-discharge current ID, the self-discharge stops substantially. This happens at time T2. Hereby, after time T2, the battery voltage VB and the circuit current IB are both constant (VB2, IBs). Note that whether the circuit current IB has converged or not should be determined by a known technique. For example, the value of the circuit current IB is sampled at suitable frequencies, and when a change of the value becomes smaller than a reference set in advance, it is determined that the circuit current IB converges.

Here, as described above, the circuit current IB can be directly grasped as the reading value of the ammeter 5. In view of this, when a reference value IK is set to the circuit current IBs after convergence, quality determination of the secondary battery 1 can be performed. When the circuit current IBs after convergence is larger than the reference value IK, the secondary battery 1 is defective with a large self-discharge amount. In the meantime, when the circuit current IBs is smaller than the reference value IK, the secondary battery 1 is a non-defective product with a low self-discharge amount.

A necessary processing time (time T1→time T2) in such an inspection method is shorter than the leaving time in the technique described in Description of Related Art. Further, since the inspection method is current measurement, the determination accuracy is higher. Note that quality determination based on the battery voltage VB2 after convergence in FIG. 3 is not so preferable means. This is because the battery voltage VB does not necessarily appear accurately as the reading value of the voltmeter 6. This is the basic principle of the inspection method of the secondary battery 1 by the measuring device 2. Further, at the time of manufacturing the secondary battery 1, an initial charge step of initially charging an assembled uncharged secondary battery 1 to a predetermined charged state so as to form a charged secondary battery 1, and an inspection step of inspecting the secondary battery 1 thus charged can be performed. In the inspection step, the inspection method should be performed.

In the description so far, the output voltage VS of the measuring device 2 is constant. However, the output voltage VS may not necessarily be constant. When the output voltage VS is changed appropriately, it is possible to further shorten the necessary processing time for determination. This will be described below.

Figure 4:
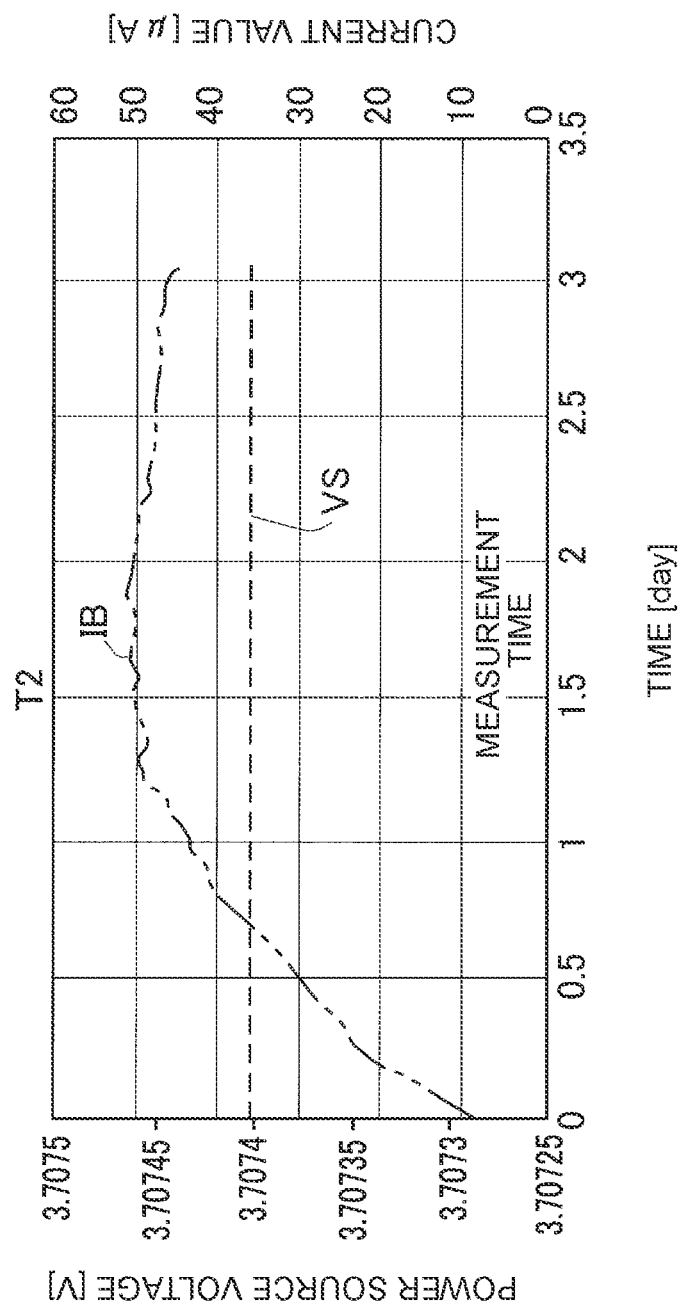
FIG. 4 is a graph illustrating an example of transition of a circuit current when an output voltage is uniform.

An advantage obtained by changing the output voltage VS will be described with reference to FIGS. 4 and 5. FIG. 4 illustrates an example of transition of an actual circuit current IB when the output voltage VS is constant as described above. In the example of FIG. 4, the output voltage VS is constant at a value initially determined and the convergence (time T2) of the circuit current IB takes about 1.5 days. The example of FIG. 4 is a measurement example under the following conditions in a state where a plurality of secondary batteries 1 and spacers 160 are bundled by a bundling member 130 so as to form a bundled body 100 as illustrated in FIG. 6. The secondary batteries 1 in the bundled body 100 are pressurized in their thickness direction.

Battery capacity: 4 Ah
Positive-electrode active material: ternary system lithium compound
Negative-electrode active material: graphite
Environmental temperature: 25° C.
Restraint load: 1 MPa Although even the necessary processing time of 1.5 days in FIG. 4 is sufficiently short as compared with determination based on the voltage measurement, the necessary processing time can be further shortened by changing the output voltage VS. FIG. 5 is its example. In the example of FIG. 5, the output voltage VS is increased, so that the circuit current IB converges in only 0.1 days. Note that the example in FIG. 5 also employs the same measurement conditions as FIG. 4. However, due to individual differences of the secondary batteries 1 as the measurement targets, the example in FIG. 5 does not have the same initial value of the output voltage VS and the same circuit current IB (IBs) after convergence as those in FIG. 4. Further, the measurement example in FIG. 5 exemplifies a non-defective secondary battery 1, and in a case of a defective secondary battery 1, the circuit current IB (IB s) after convergence becomes a further large value.

Figure 5:
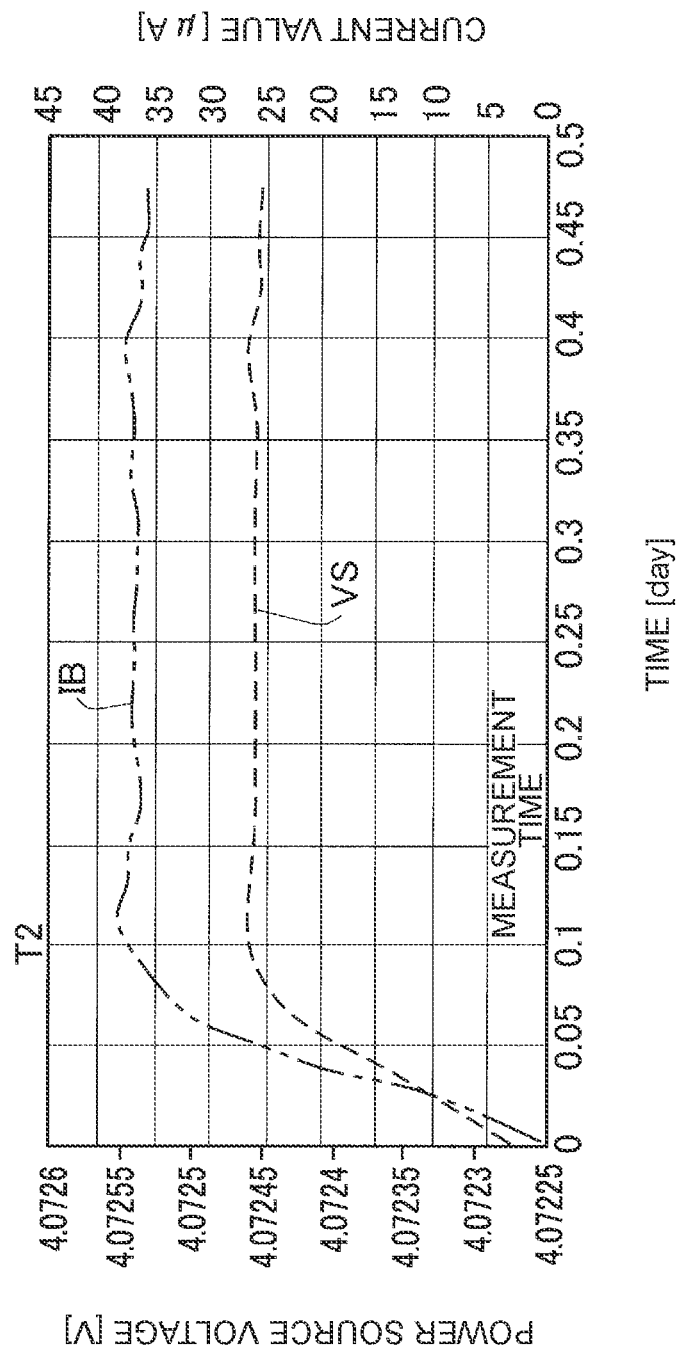
FIG. 5 is a graph illustrating an example of transition of the circuit current when the output voltage is increased.
Figure 6:
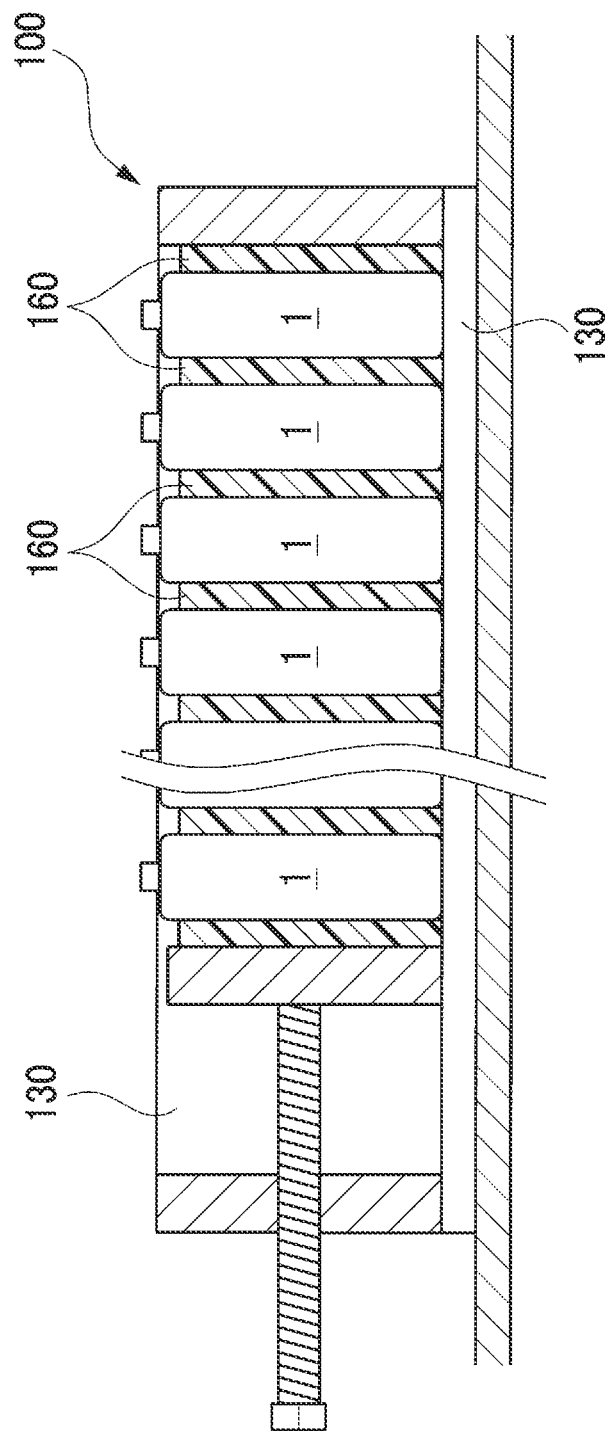
FIG. 6 is a schematic view illustrating a state where a plurality of secondary batteries as inspection targets and spacers are bundled by a bundling member so as to form a bundled body in the embodiment.

The following further describes a case where the output voltage VS is increased like FIG. 5. First, the circuit current IB of the circuit 3 in FIG. 1 is given by Equation (1) as follows based on the output voltage VS of the measuring device 2, the battery voltage VB, and the parasitic resistance Rx.

$$IB=(VS-VB)/Rx \qquad (1)$$

Here, when it is assumed that the output voltage VS is constant, the circuit current IB increases due to a decrease of the battery voltage VB along with self-discharge of the secondary battery 1, as has been described in the foregoing. When the circuit current IB increases and reaches the same magnitude as the self-discharge current ID, the discharge of the secondary battery 1 stops substantially. Hereby, as described above, the battery voltage VB and the circuit current IB are both constant (VB2, IBs) afterward. That is, the circuit current IBs after convergence indicates the self-discharge current ID of the electromotive element E of the secondary battery 1.

Even in the case where the output voltage VS is increased, Equation (1) is also established. However, since the output voltage VS increases, the increase of the circuit current IB is faster by just that much than a case where the output voltage VS is constant. Because of this, a necessary time until the circuit current IB reaches the self-discharge current ID is short. This is the reason why the circuit current IB converges early as has been described in the foregoing. However, if the output voltage VS is increased blindly, the increase might be excessive. This results in that the circuit current IB does not converge appropriately and the determination cannot be performed. On that account, it is necessary to restrict the degree of the increase of the output voltage VS. In the present embodiment, more specifically, the output voltage VS is increased within a range where the parasitic resistance Rx seems to become small in Equation (1). The reason is as follows: when the parasitic resistance Rx becomes small, the circuit current IB is increased by just that much.

Figure 7:
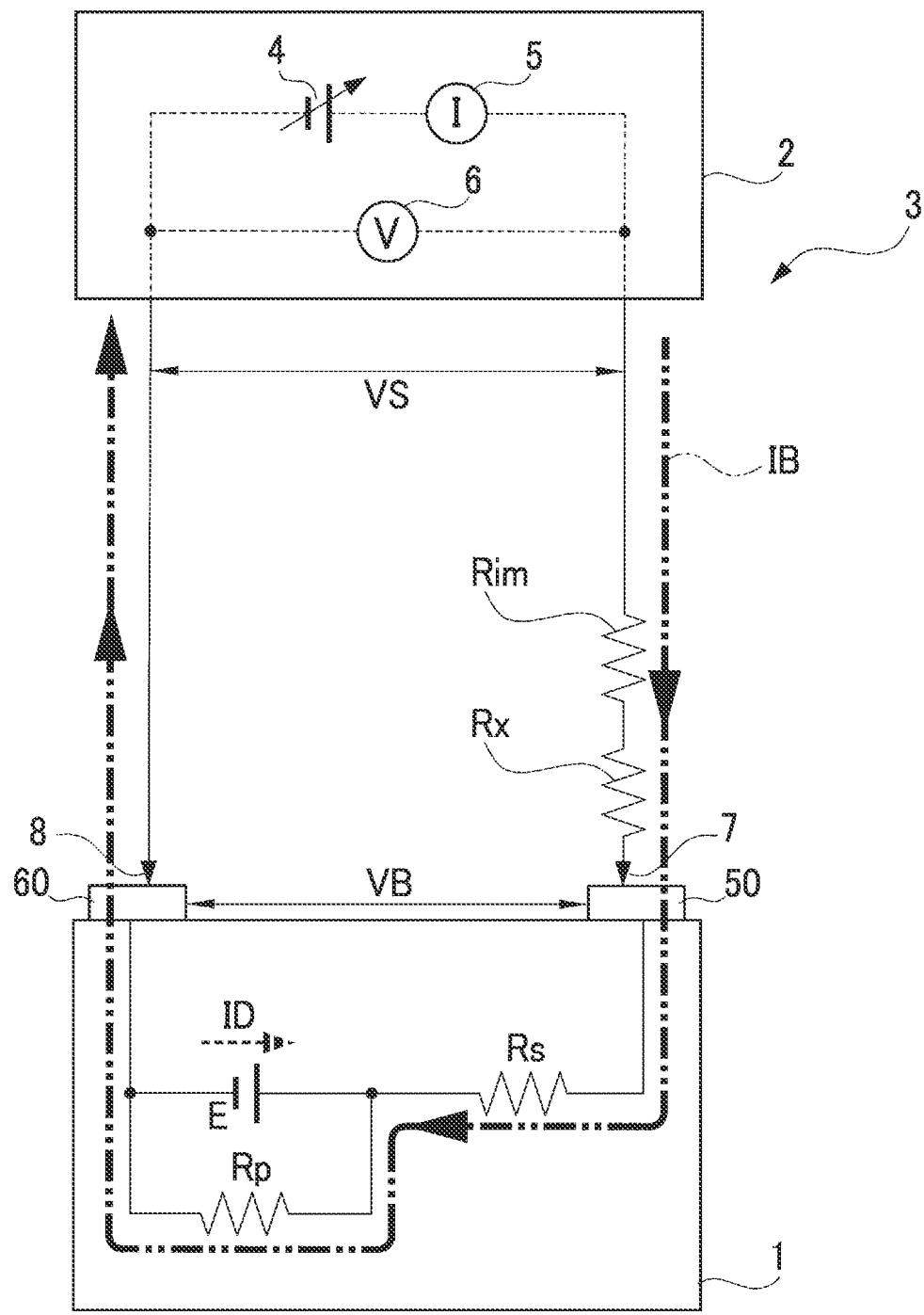
FIG. 7 is a circuit diagram in which a fictitious resistance is introduced.

In view of this, in the present embodiment, as illustrated in FIG. 7, a concept of a fictitious resistance Rim is introduced. The fictitious resistance Rim is a virtual resistance having a negative resistance value or a resistance value of zero. In the circuit diagram of FIG. 7, the fictitious resistance Rim is inserted in series with the parasitic resistance Rx. Such a resistance does not really exist, but the examination is made such that a state where the output voltage VS increases is replaced with a model in which the output voltage VS is constant and an absolute value of a resistance value of the fictitious resistance Rim increases instead. Note that the sum of the parasitic resistance Rx and the fictitious resistance Rim decreases but should be positive. In the following description, the sum of the parasitic resistance Rx and the fictitious resistance Rim is referred to as a pseudo parasitic resistance Ry. A circuit current in a model into which the pseudo parasitic resistance Ry is introduced is expressed by Equation (2) as follows.

$$IB=(VS-VB)/(Rx+Rim) \qquad (2)$$

Here, it is assumed that the parasitic resistance Rx is 5Ω. Then, a case where the fictitious resistance Rim is 0Ω and a case where the fictitious resistance Rim is −4Ω have different circuit currents IB. That is, the circuit current IB of the case of −4Ω (corresponding to the time after the measurement is started) is five times larger than the circuit current IB in the case of 0Ω (corresponding to the time when the measurement is started) according to Equation (2). This is because the pseudo parasitic resistance Ry (=Rx+Rim) in the case of −4Ω is one-fifth of that in the case of 0Ω.

When Equation (2) is arranged, Equation (3) is obtained.

$$VS=VB+(Rx+Rim)*IB \qquad (3)$$

Equation (3) shows that, when the product of the pseudo parasitic resistance Ry with the circuit current IB is added to the battery voltage VB, the output voltage VS is obtained. Since the fictitious resistance Rim in the pseudo parasitic resistance Ry does not actually exist as has been described in the foregoing, Equation (3) is established by increasing the output voltage VS to a voltage obtained by adding the product of the parasitic resistance Rx with the circuit current IB to the battery voltage VB. That is, a value obtained by dividing an increment of the output voltage VS by the circuit current IB corresponds to the absolute value of the fictitious resistance Rim.

In a case where the output voltage VS is adjusted to the initial battery voltage VB1 and the measurement is started as described above, the output voltage VS is increased in accordance with the circuit current IB at every timing at an appropriate frequency according to Equation (3). The frequency at which the output voltage VS is increased is about one time per one second, for example. Note that the frequency may not be fixed. With such a configuration, as the circuit current IB after inspection is started largely increases, an increase width of the output voltage VS is larger. Further, when the increase of the circuit current IB converges, the increase of the output voltage VS also converges. Hereby, the measurement as illustrated in FIG. 5 can be achieved.

Note that, according to the above description, the increase width of the output voltage VS with respect to an increment of the circuit current IB is the product of the parasitic resistance Rx with the circuit current IB. That is, when the increase width of the output voltage VS is indicated by $\Delta VS$, the increase width $\Delta VS$ is given as Equation (4) as follows.

$$\Delta VS = Rx * IB \tag{4}$$

Alternatively, the increase width $\Delta VS$ may be a value obtained by multiplying the product in Equation (4) by a positive coefficient K less than 1. A specific value of the coefficient K is any value within the above range and should be determined in advance. That is, the increase width $\Delta VS$ may be calculated according to Equation (5) as follows.

$$\Delta VS = K * Rx * IB \tag{5}$$

Note that the product of the coefficient K with the parasitic resistance Rx may be found in advance as a constant M and the increase width $\Delta VS$ of the output voltage VS may be calculated by multiplying the circuit current IB by the constant M. In this case, the output voltage VS in the middle of the inspection is calculated according to Equation (6).

$$VS = VB + M * IB \tag{6}$$

From the viewpoint that the increase of the circuit current IB converges early, it is the most effective to take the product of Equation (4) as the increase width of the output voltage VS without any change. However, in this case, the pseudo parasitic resistance Ry might become negative due to the accuracy of the value of the parasitic resistance Rx and other reasons. This results in that the change of the circuit current IB diverges, so that necessary measurement cannot be performed. In view of this, the multiplication by the coefficient makes it possible to avoid the risk of divergence.

Here, it is necessary to know the value of the parasitic resistance Rx in order to actually perform measurement by this control. Respective contact resistances between the probe 7 and the terminal 50 and between the probe 8 and the terminal 60 in the parasitic resistance Rx change every time the circuit 3 is assembled. However, the parasitic resistance Rx including the contact resistances can be measured in the following manner, for example. That is, in FIG. 1, a reading value of the voltmeter 6 is measured in two states, i.e., a state where the output voltage VS of the direct-current power source 4 is turned off and the terminals of the measuring device 2 are connected via a suitable resistance and a state where the terminals are disconnected. As a result, the parasitic resistance Rx can be calculated based on a resistance value of the suitable resistance and two reading values of the voltmeter 6.

As such, the output voltage VS is increased while the value of the circuit current IB is fed back to the output voltage VS. Hereby, the increase of the circuit current IB can converge early. Thus, it is possible to further shorten the necessary processing time for determination.

In the present embodiment, adjustment based on the power storage capacity of the secondary battery 1 is further taken into consideration in addition to the above. This is because how much the pseudo parasitic resistance Ry can be reduced varies in accordance with the magnitude of the power storage capacity of the secondary battery 1. The reason is as follows. In the circuit 3, the circuit current IBs after convergence in a case where the output voltage VS is constant is proportional to the power storage capacity of the secondary battery 1. Meanwhile, a decrease width from the initial battery voltage VB1 of the battery voltage VB2 after convergence is irrelevant to the power storage capacity of the secondary battery 1. When this is applied to Equation (2), the denominator (=the pseudo parasitic resistance Ry) in the right side becomes smaller as the power storage capacity is larger. This is the reason why a possible lower limit of the pseudo parasitic resistance Ry depends on the power storage capacity.

Further, this can be also described based on a relationship with the accuracy of the voltage. When setting accuracy of the output voltage VS of the direct-current power source 4 is low, a deviation from a target value for the value of the circuit current IB occurs. Assume a case where the output voltage VS to be applied temporarily becomes larger than its target value and decreases to the target value after that. The deviation of the circuit current IB in this case is proportional to the deviation of the battery voltage VB and inversely proportional to the pseudo parasitic resistance Ry. The deviation of the battery voltage VB depends on how much the secondary battery 1 is charged while the output voltage VS larger than the target value is applied temporarily. However, it can be also said that the deviation of the battery voltage VB is inversely proportional to the power storage capacity of the secondary battery 1. That is, when the power storage capacity of the secondary battery 1 is large, the deviation of the battery voltage VB and the deviation of the circuit current IB are small.

From the above description, it is found that, in a case where the power storage capacity of the secondary battery 1 is large, even if the pseudo parasitic resistance Ry is largely reduced, the divergence of the circuit current IB can hardly occur. In the meantime, in a case where the power storage capacity of the secondary battery 1 is small, the divergence of the circuit current IB due to reduction of the pseudo parasitic resistance Ry easily occurs. This is another reason why a possible lower limit of the pseudo parasitic resistance Ry depends on the power storage capacity.

In view of this, in the present embodiment, the inspection is performed in the following procedure.

1. The circuit 3 illustrated in FIG. 1 (FIG. 7) is assembled such that the secondary battery 1 is connected to the measuring device 2.
↓
2. An initial value of the circuit current IB is set.
↓
3. The pseudo parasitic resistance Ry is set in accordance with the power storage capacity of the secondary battery 1.
↓
4. The self-discharge current ID is measured by use of the pseudo parasitic resistance Ry thus set.

In the secondary battery 1 at the time of "1," it is preferable that not only initial charge but also high-temperature aging be finished, as described above. As described above, "2" is to adjust the output voltage VS so that the circuit current IB becomes zero. Here, "3" will be described later. Further, "4" is measurement of a convergence state of the circuit current IB illustrated in FIGS. 3 to 5. Using the pseudo parasitic resistance Ry means that the measurement is performed while the output voltage VS is increased, as described in FIG. 5.

Now, "3" will be described. Based on the foregoing, the pseudo parasitic resistance Ry is set in accordance with the power storage capacity of the secondary battery 1 based on the following thought. That is, when the power storage capacity is large, the pseudo parasitic resistance Ry is set to a small value. Note that the pseudo parasitic resistance Ry should be a positive value as has been described in the foregoing. In the meantime, when the power storage capacity is small, the pseudo parasitic resistance Ry is set to a large value. Here, as the power storage capacity of the secondary battery 1, a designed value may be used without any change. Note that an actual value may be used. Measurement of the actual value of the power storage capacity may be performed such that the secondary battery 1 that is fully charged is discharged at a uniform discharging current and a necessary time to take until the secondary battery 1 is fully discharged is measured.

Accordingly, in a current measurement step in "4," the self-discharge current ID is measured by use of the pseudo parasitic resistance Ry set in "3." Hereby, in a case where the power storage capacity is small, the degree of the increase of the output voltage VS is set moderately. In the meantime, in a case where the power storage capacity is large, the degree of the increase of the output voltage VS is set to be high. This makes it possible to shorten the measurement time to its limit that does not cause the divergence of the circuit current IB.

Here, the deviation of the circuit current IB due to the power storage capacity of the secondary battery 1 appears as a fluctuation of the actually measured circuit current IB. This will be described with reference to FIGS. 8A to 10B. The graphs in the figures each illustrate changes of the circuit current IBs in the circuit 3 with time. A part after convergence is particularly illustrated on the lower side in an enlarged manner. Note that it should be noted that scales of vertical axes are not the same.

Figure 8A:
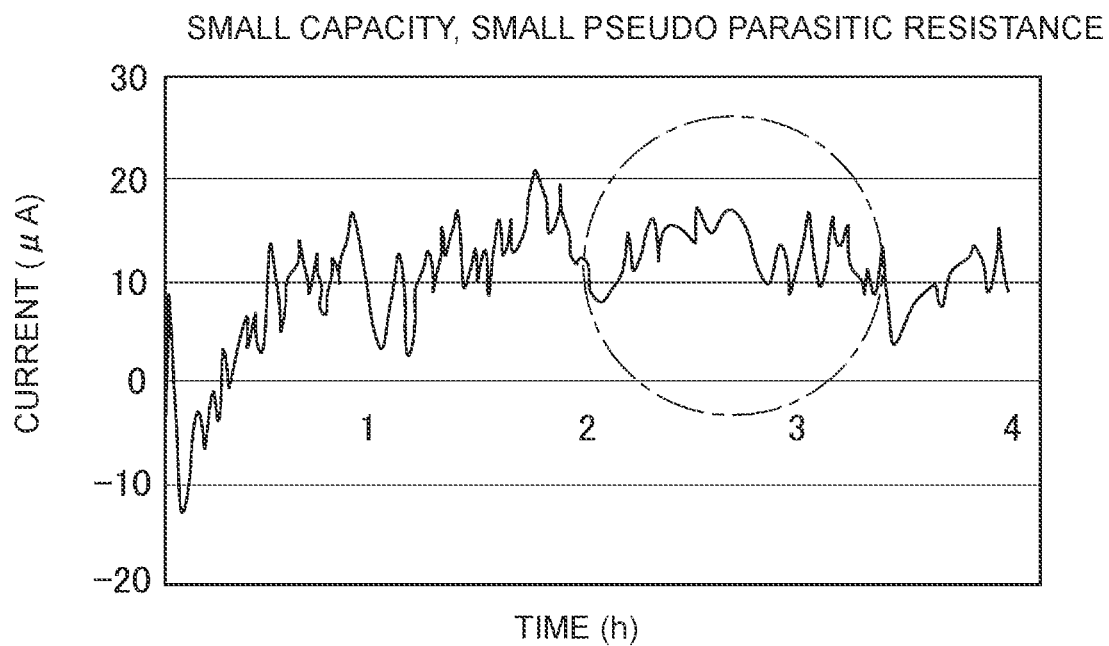
FIG. 8A is a graph illustrating fluctuations of a circuit current (in a case where a power storage capacity is small and a pseudo parasitic resistance is small)
Figure 8B:
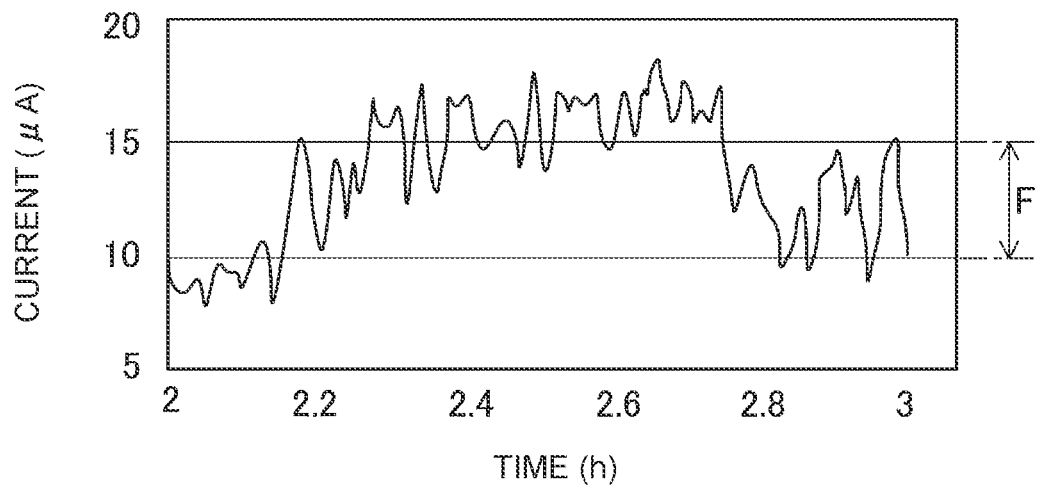
FIG. 8B is a graph illustrating the fluctuations of the circuit current (in the case where the power storage capacity is small and the pseudo parasitic resistance is small) and is a graph illustrating a range indicated by a circle of an alternate long and short dash line in the graph of FIG. 8A in an enlarged manner.
Figure 9A:
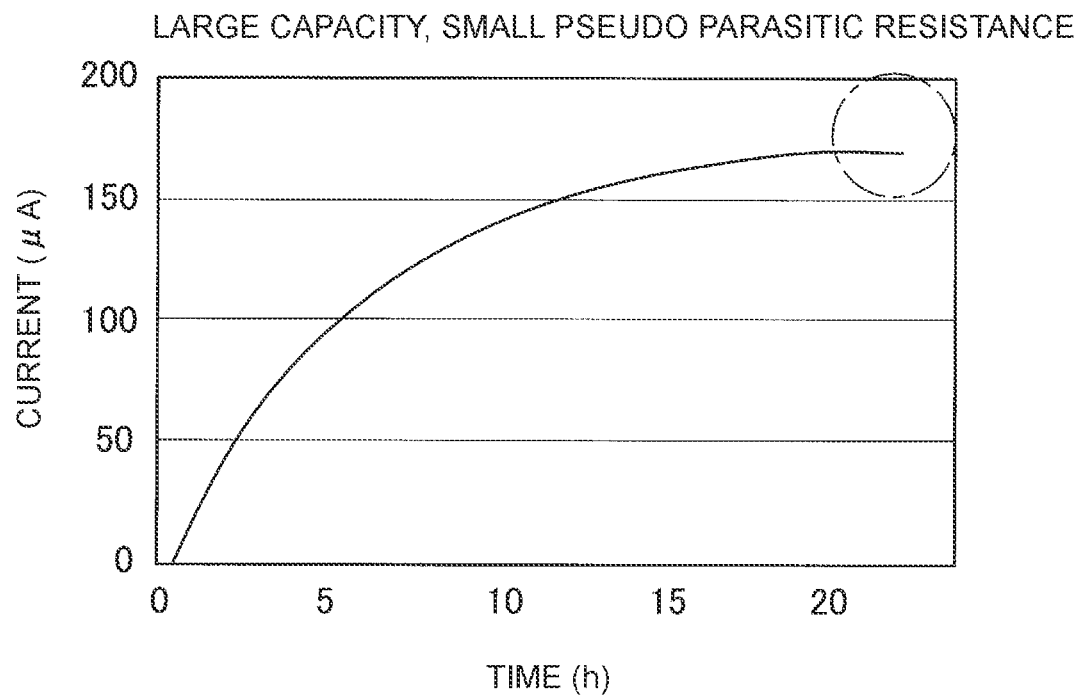
FIG. 9A is a graph illustrating fluctuations of a circuit current (in a case where a power storage capacity is large and a pseudo parasitic resistance is small)
Figure 9B:
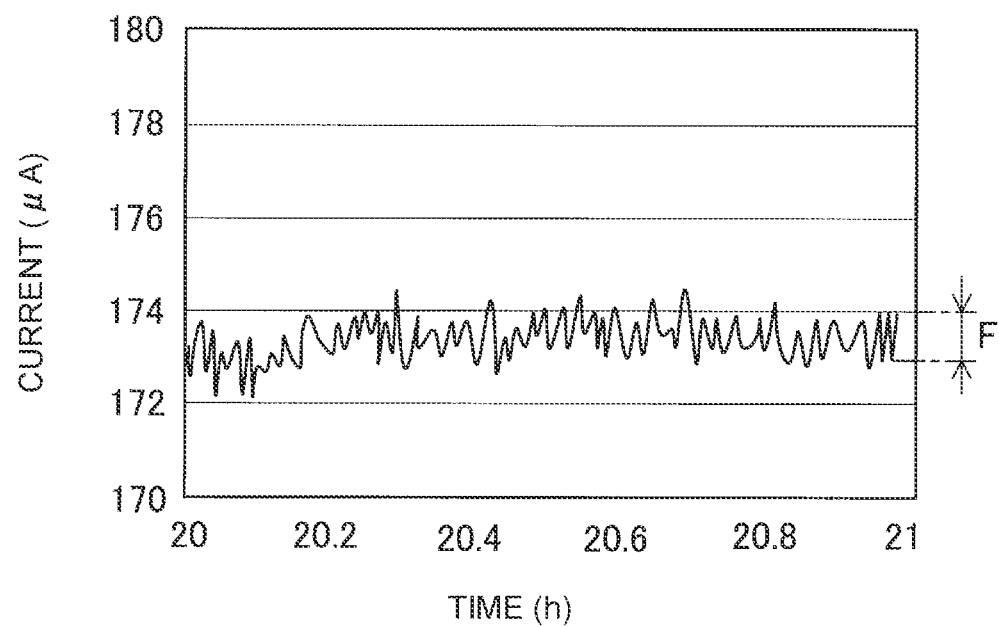
FIG. 9B is a graph illustrating the fluctuations of the circuit current (in the case where the power storage capacity is large and the pseudo parasitic resistance is small) and is a graph illustrating a range indicated by a circle of an alternate long and short dash line in the graph of FIG. 9A in an enlarged manner.

Among three graphs, FIGS. 8A, 8B and FIGS. 9A, 9B are focused first. FIGS. 8A, 8B illustrate a graph in a case where the power storage capacity is small (4 Ah), and FIGS. 9A, 9B illustrate a graph in a case where the power storage capacity is large (35 Ah). The pseudo parasitic resistance Ry is 0.1Ω (small) in either case. When the graph of FIG. 8B is compared with the graph in FIG. 9B, they are different in amplitude F of the circuit current IB. The amplitude F in FIG. 9B with a large power storage capacity is about less than 1 μA, whereas the amplitude F in FIG. 8B with a small power storage capacity is about 4 μA to 5 μA. Of course, the magnitude relationship of the circuit current IB itself corresponds to the magnitude of the power storage capacity, but the magnitude of the amplitude F is reversed thereto. As such, the case where the power storage capacity is large is compared with the case where the power storage capacity is small, while their pseudo parasitic resistances Ry are set to the same. Here, it is found that the deviation of the circuit current IB is large in the case where the power storage capacity is small. This indicates that the value of 0.1Ω as the pseudo parasitic resistance Ry is too small for the secondary battery 1 with a small power storage capacity of 4 Ah.

Figure 10A:
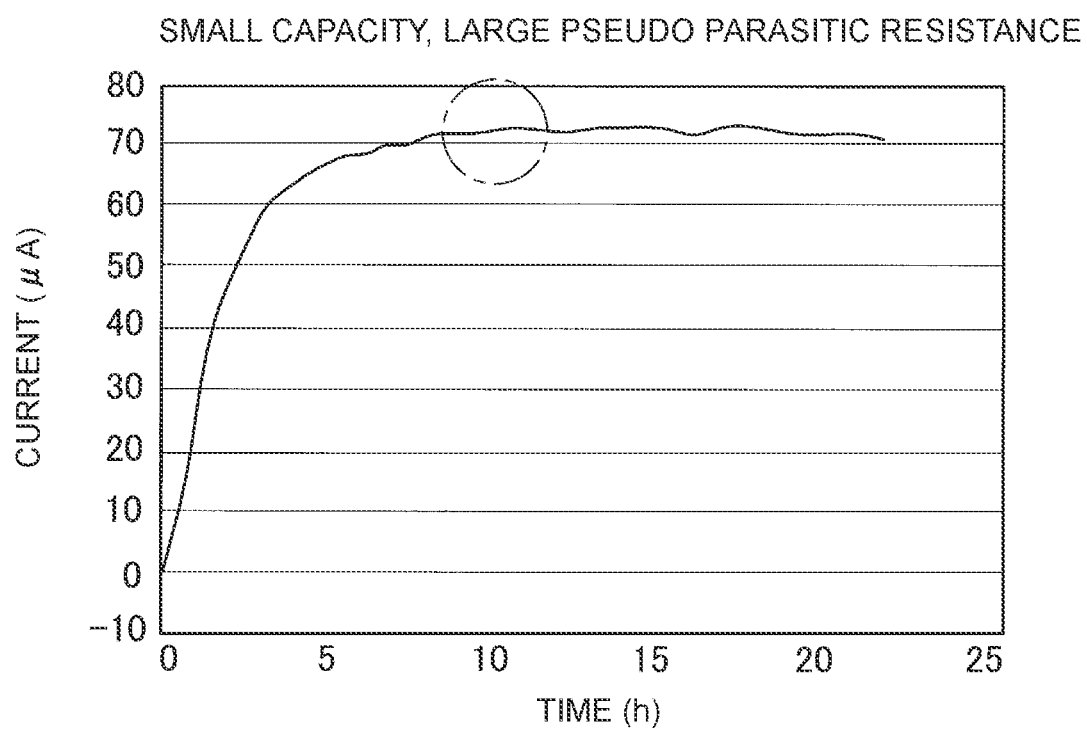
FIG. 10A is a graph illustrating fluctuations of a circuit current (in a case where a power storage capacity is small and a pseudo parasitic resistance is large)
Figure 10B:
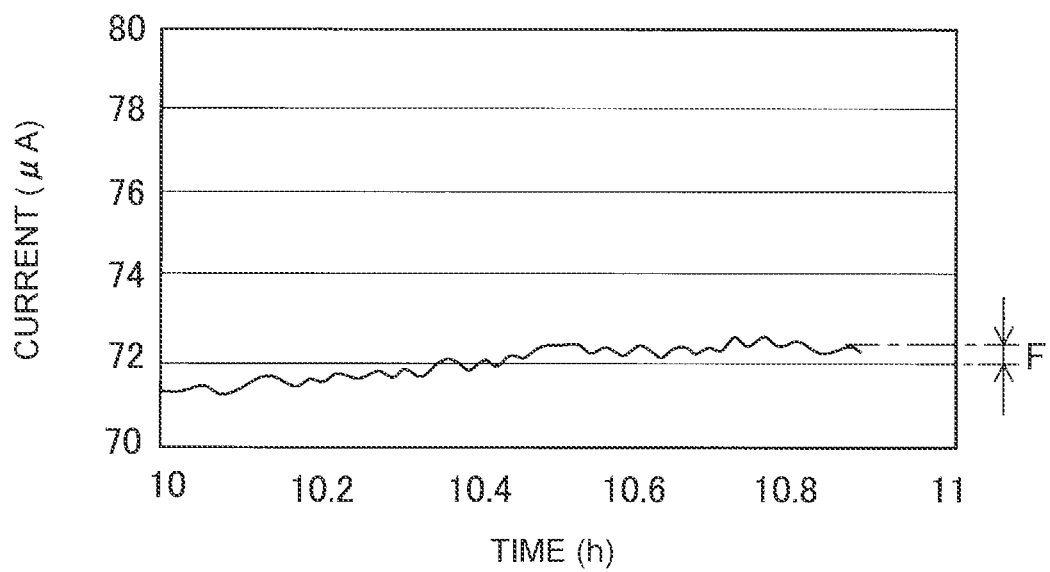
FIG. 10B is a graph illustrating the fluctuations of the circuit current (in the case where the power storage capacity is small and the pseudo parasitic resistance is large) and is a graph illustrating a range indicated by a circle of an alternate long and short dash line in the graph of FIG. 10A in an enlarged manner.

Now, FIGS. 8A, 8B and FIGS. 10A, 10B are focused. FIGS. 8A, 8B illustrate a graph in a case where the pseudo parasitic resistance Ry is set to be small (0.1Ω), and FIGS. 10A, 10B illustrate a graph in a case where the pseudo parasitic resistance Ry is set to be large (1Ω). The power storage capacity is 4 Ah (small) in either case. The amplitude F of the circuit current IB in the graph of FIG. 8B is compared with that of the graph in FIG. 10B. The amplitude F in FIG. 10B with a large resistance is about less than 0.5 μA, whereas the amplitude F in FIG. 8B with a small resistance is about 4 μA to 5 μA. As such, the case where the pseudo parasitic resistance Ry is large is compared with the case where the pseudo parasitic resistance Ry is small, while their power storage capacities are set to the same. Here, it is found that the deviation of the circuit current IB is large in the case where the pseudo parasitic resistance Ry is small. This indicates that the value of 0.1Ω as the pseudo parasitic resistance Ry is too small for the secondary battery 1 with a small power storage capacity of 4 Ah.

Thus, from the comparison between FIGS. 8A, 8B and FIGS. 9A, 9B and the comparison between FIGS. 8A, 8B and FIGS. 10A, 10B, it is found that, in "3," in the case where the power storage capacity is large, the pseudo parasitic resistance Ry should be set to a small value, and in the case where the power storage capacity is small, the pseudo parasitic resistance Ry should be set to a large value. Note that FIGS. 8A, 8B illustrate an example (a comparative example) of unfavorable setting as understood from the above. In the graph of FIGS. 8A, 8B, the circuit current IB does not diverge, but the circuit current IB may diverge without converging depending on a setting degree. Further, a case where the power storage capacity and the pseudo parasitic resistance Ry are both large is not illustrated, but, in this case, the amplitude F of the circuit current IB is remarkably small while a convergence time of the circuit current IB cannot be shortened so much.

Figure 11:
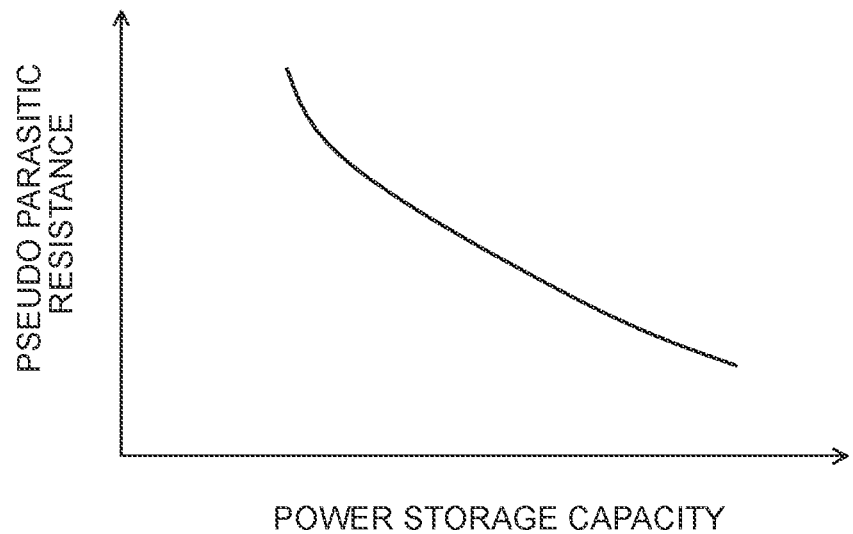
FIG. 11 is a graph qualitatively illustrating a relationship between power storage capacity and set pseudo parasitic resistance.

Hereby, a qualitative relationship between the power storage capacity of the secondary battery 1 as an inspection target and the pseudo parasitic resistance Ry to be set is a relationship going downward toward the right side as illustrated in the graph of FIG. 11. Specific values of the vertical axis and the horizontal axis are not described in FIG. 11, but a value of the pseudo parasitic resistance Ry to each value of the power storage capacity should be determined in advance based on a type or a specification of the secondary battery 1 as an inspection target, required inspection accuracy, and the like.

Figure 12:
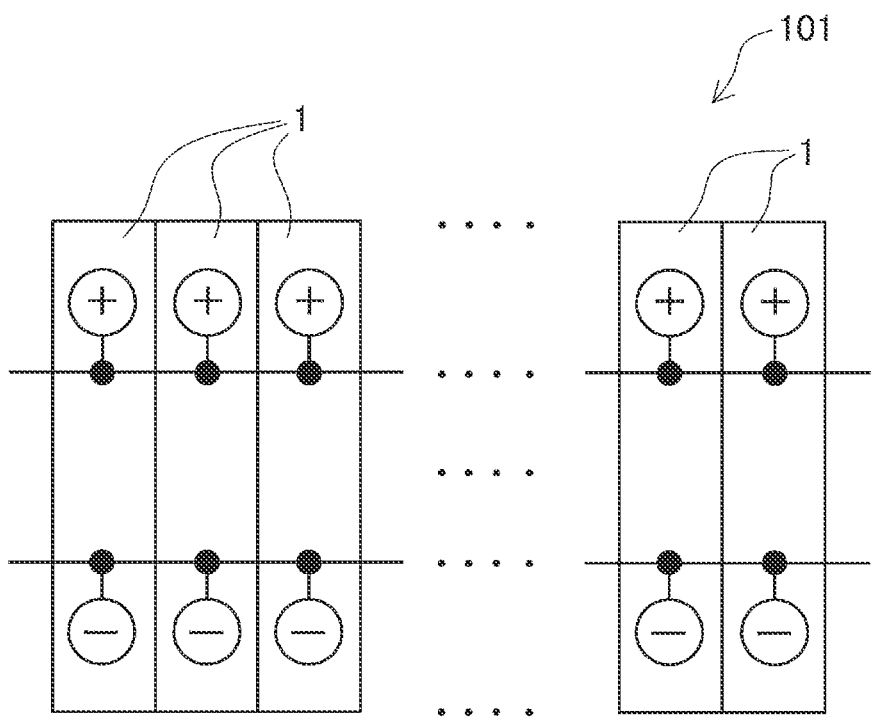
FIG. 12 is a schematic view illustrating a parallel stack of a plurality of secondary batteries.

Next will be described a case where a parallel stack of secondary batteries 1 is taken as an inspection target. The inspection of the present embodiment can be performed on a single secondary battery 1 as an inspection target and can be also performed on a parallel stack 101 as an inspection target. In the parallel stack 101, a plurality of secondary batteries 1 is connected in parallel to each other as illustrated in FIG. 12. The power storage capacity of the secondary battery 1 in this case indicates a sum of individual secondary batteries 1 included in the parallel stack 101. Further, the parallel stack 101 may be the bundled body 100 by use of the bundling member 130 as illustrated in FIG. 6.

When the parallel stack 101 is taken as an inspection target, the inspection can be performed in a shorter time in comparison with a case where a single secondary battery 1 is taken as an inspection target. This is because the power storage capacity of the parallel stack 101 is larger than the power storage capacity of the single secondary battery 1, naturally, and therefore, the inspection can be performed by setting the pseudo parasitic resistance Ry to be lower. Note that the determination performable when the parallel stack 101 is inspected by the method in the present embodiment is about the quality of the whole parallel stack 101, and not about the quality of each of the secondary batteries 1 included therein.

As specifically described above, with the present embodiment, the quality inspection of the secondary battery 1 is performed based on a convergence value IBs of the circuit current IB. On this account, it is possible to perform inspection in a short time with high accuracy, as compared to a case where the inspection is performed based on voltage measurement. Further, by introducing the concept of a negative fictitious resistance Rim, that is, by increasing the output voltage VS of the measuring device 2, further shortening of the inspection time is achieved. Further, the pseudo parasitic resistance Ry as a sum of the fictitious resistance Rim and the parasitic resistance Rx is set in accordance with the power storage capacity of the secondary battery 1 (or the parallel stack 101) as an inspection target, so that a quality inspection is performed by optimum setting suitable for the power storage capacity. Thus, an inspection method of an electrical storage device and a manufacturing method of an electrical storage device each of which can perform quality determination of the electrical storage device quickly regardless of variations of various conditions are achieved.

Note that the present embodiment is merely an example and does not limit the disclosure at all. Accordingly, it goes without saying that the disclosure can be altered or modified variously within a range that does not deviate from the gist of the disclosure. For example, the description of the embodiment deals with an aspect in which the output voltage VS is increased from the same voltage as the initial battery voltage VB1. In the meantime, such an aspect is also employable that an initial value VSI of the output voltage VS is daringly set to be higher than the initial battery voltage VB1.

Further, in the embodiment, the pseudo parasitic resistance Ry is set by adjusting the fictitious resistance Rim, but the pseudo parasitic resistance Ry can be set by adjusting the parasitic resistance Rx. Further, the inspection method of the present embodiment is not limited to a secondary battery just manufactured as a new product, and can be performed on a used secondary battery for a remanufacturing process of a used assembled battery. Further, an electrical storage device as a determination target is not limited to the secondary battery and may be capacitors such as an electric double layer capacitor and a lithium-ion capacitor.

What is claimed is:

1. An inspection method of an electrical storage device, the inspection method comprising:
setting a pseudo parasitic resistance value to be small in a case where a power storage capacity of the electrical storage device is large, as compared to a case where the power storage capacity is small, while setting the pseudo parasitic resistance value to be large in the case where the power storage capacity of the electrical storage device is small, as compared to the case where the power storage capacity is large, the pseudo parasitic resistance value being obtained by dividing, by a first current value of a circuit, an excessive amount of a voltage value of an external power source with respect to an initial voltage value of the electrical storage device;
in a state where the pseudo parasitic resistance value is set, acquiring a second current value after convergence of a current flowing through the circuit such that the circuit is formed by connecting the external power source to the electrical storage device in a direction where a voltage of the external power source is applied to the electrical storage device; and
determining quality of the electrical storage device based on the second current value.

2. The inspection method according to claim 1, wherein:
a parallel stack is formed by connecting a plurality of the electrical storage devices in parallel to each other;
in the acquiring of the second current value, the circuit is formed by connecting the external power source to the parallel stack that has been charged;
in the setting of the pseudo parasitic resistance value, the pseudo parasitic resistance value is set in accordance with the power storage capacity of the parallel stack; and
in the determining of the quality of the electrical storage device, quality of the parallel stack is determined.

3. A manufacturing method of the electrical storage device, the manufacturing method comprising:
providing the electrical storage device;
connecting the external power source to the electrical storage device;
performing initial charge such that the electrical storage device being assembled and uncharged is charged to a predetermined charged state, such that the electrical storage device that has been charged is formed; and
inspecting the electrical storage device that has been charged by the inspection method according to claim 1.

* * * * *